(12) United States Patent
Yoo

(10) Patent No.: US 9,696,487 B2
(45) Date of Patent: Jul. 4, 2017

(54) REDUCTION OF THERMO-OPTIC EFFECTS IN SILICON PHOTONICS

(71) Applicant: The Regents of the University of California, Oakland, CA (US)

(72) Inventor: Sung-Joo Ben Yoo, Davis, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 14/697,169

(22) Filed: Apr. 27, 2015

(65) Prior Publication Data

US 2015/0309253 A1    Oct. 29, 2015

Related U.S. Application Data

(60) Provisional application No. 61/985,166, filed on Apr. 28, 2014.

(51) Int. Cl.
| | |
|---|---|
| *G02B 6/12* | (2006.01) |
| *G02B 6/122* | (2006.01) |
| *G02B 1/02* | (2006.01) |
| *G02B 6/132* | (2006.01) |
| *C23C 14/08* | (2006.01) |
| *C23C 14/58* | (2006.01) |
| *C23C 14/00* | (2006.01) |

(52) U.S. Cl.
CPC .......... *G02B 6/122* (2013.01); *C23C 14/0036* (2013.01); *C23C 14/083* (2013.01); *C23C 14/5806* (2013.01); *G02B 1/02* (2013.01); *G02B 6/132* (2013.01); *G02B 2006/12061* (2013.01); *G02B 2006/12135* (2013.01); *G02B 2006/12142* (2013.01); *G02B 2006/12159* (2013.01)

(58) Field of Classification Search
CPC .... G02B 6/132; G02B 6/1223; G02B 6/4206; G02B 6/0229; G02B 6/0219; G02B 6/12019; G02B 2006/12176; G02B 2006/12038; G02B 2006/12061; G02B 2006/12107
See application file for complete search history.

(56) References Cited

U.S. PATENT DOCUMENTS

| | | | | |
|---|---|---|---|---|
| 5,664,038 A | * | 9/1997 | Okushima | G02B 6/12007 385/22 |
| 6,233,386 B1 | * | 5/2001 | Paek | G02B 6/0219 385/123 |
| 2002/0181917 A1 | * | 12/2002 | Noro | G02B 6/12011 385/132 |
| 2003/0063883 A1 | * | 4/2003 | Demaray | B29D 11/00663 385/129 |
| 2003/0161571 A1 | * | 8/2003 | Davids | G02B 6/4214 385/14 |

(Continued)

*Primary Examiner* — Thomas A Hollweg
*Assistant Examiner* — Mary A El Shammaa
(74) *Attorney, Agent, or Firm* — Park, Vaughan, Fleming & Dowler LLP

(57) ABSTRACT

A method and system are described for reducing a thermo-optic effect in silicon photonics. In described embodiments, the system comprises a silicon photonic device with a silicon core that includes a cladding layer comprising titanium adjacent to the silicon core. In described embodiments, the method comprises providing a silicon core and depositing a cladding layer adjacent to the silicon photonic core, wherein the cladding layer comprises titanium.

19 Claims, 2 Drawing Sheets

(56) References Cited

U.S. PATENT DOCUMENTS

| | | | | |
|---|---|---|---|---|
| 2007/0254484 A1* | 11/2007 | Feng | ............... | C09G 1/02 438/692 |
| 2008/0253728 A1* | 10/2008 | Sparacin | ............... | B82Y 20/00 385/132 |
| 2010/0260462 A1* | 10/2010 | Zhang | ............... | B82Y 20/00 385/131 |

* cited by examiner

REDUCTION OF THERMO-OPTIC EFFECTS IN SILICON PHOTONICS

RELATED APPLICATION

This application claims priority under 35 U.S.C. §119 to U.S. Provisional Application No. 61/985,166, entitled "Athermal Silicon Photonics with CMOS Compatibility," by Sung-Joo Ben Yoo, filed 28 Apr. 2014, the contents of which are herein incorporated by reference in their entirety.

BACKGROUND

Field

The described embodiments relate to photonic structures with reduced thermal variation of optical parameters. More specifically, the described embodiments relate to silicon photonic structures with a reduced thermo-optic effect.

Related Art

Silicon photonics have been used in an increasing variety of applications, including waveguides, modulators, resonators, and lasers. In many of these applications, the functioning of the silicon photonic devices may depend on the index of refraction of the silicon. However, the index of refraction of silicon varies with temperature due to the thermo-optic effect, and the amount that the index of refraction varies with temperature is called the thermo-optic coefficient ("TOC"). Since many silicon photonic devices may be used in environments that have temperature variations during their operation, the TOC of silicon may result in the optical properties of silicon photonic devices varying with temperature to an extent that their operation is adversely impacted.

Active temperature stabilization techniques to control the temperature of silicon photonic devices have been used to limit the temperature variation and thus reduce the impact of the TOC of silicon on the functioning of many of these devices. However, active temperature stabilization may be difficult to implement for some devices, and if implemented may be energy-inefficient.

Passive compensation for the TOC of silicon has been implemented using polymer cladding materials such as Poly-Methyl-Meth-Acrylate (PMMA) with a negative TOC to compensate for the positive TOC of the silicon in some photonic devices. However, such polymer materials may not be compatible with the processes typically used in the fabrication of complementary metal-oxide semiconductor (CMOS) devices, and therefore these polymers may not be able to be readily incorporated into existing CMOS fabrication processes. Additionally, these polymers may absorb water, become chemically unstable, be mechanically weak, and/or undergo photo-degradation and, therefore, may often be undesirable for use in silicon photonic devices.

SUMMARY

Disclosed embodiments describe a silicon photonic device comprising a silicon core and a cladding layer comprising titanium adjacent to the silicon core.

In some embodiments, the cladding layer comprises amorphous titanium dioxide.

In some embodiments, the silicon photonic device comprises a waveguide, and over a bandwidth of the silicon photonic device for a mode of the waveguide, a ratio of a fraction of a total power of the mode in the core to a fraction of the total power of the mode in the cladding is in the range from 90% to 110% of negative one times a ratio between a thermo-optic coefficient of the cladding to a thermo-optic coefficient of the core.

In some embodiments, a loss in the cladding layer for a wavelength of operation of the silicon photonic device is less than or equal to 7 dB/cm.

In some embodiments, the silicon photonic device comprises a waveguide.

In some embodiments, the silicon photonic device comprises an arrayed waveguide grating.

In some embodiments, the silicon photonic device comprises a Mach-Zehnder interferometer.

In some embodiments, the silicon photonic device comprises a modulator.

In some embodiments, the silicon photonic device comprises a resonator.

In some embodiments, the silicon photonic device comprises a laser.

Disclosed embodiments also provide a method of preparing a silicon photonic device comprising providing a silicon core and depositing a cladding layer adjacent to the silicon core, wherein the cladding layer comprises titanium.

In some embodiments, the silicon photonic device includes a substrate, and during the step of depositing the cladding layer an average temperature of the substrate is less than or equal to 20° C.

In some embodiments, the step of depositing the cladding layer comprises depositing the cladding layer at a rate of less than or equal to 5 nm/minute.

In some embodiments, the step of depositing the cladding layer comprises depositing the cladding layer using RF magnetron reactive sputtering.

In some embodiments, after the step of depositing the cladding layer, the method further includes annealing the silicon photonic device at a temperature of less than or equal to 550° C.

In some embodiments, depositing the cladding layer includes depositing the cladding layer using sputtering with an oxygen flow rate in the range from 6% to 24% of a total gas flow rate during the sputtering.

In some embodiments, depositing the cladding layer includes depositing the cladding layer using sputtering with an oxygen flow rate in the range from 12% to 18% of a total gas flow rate during the sputtering.

BRIEF DESCRIPTION OF THE FIGURES

In the figures, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The following detailed description should be read with reference to the drawings in which similar elements in different drawings may be numbered the same. The drawings, which are not necessarily to scale, depict illustrative embodiments and are not intended to limit the scope of the invention.

In the following description, we refer to "some embodiments." Note that "some embodiments" may describe a subset of all of the possible embodiments, but does not always specify the same subset of embodiments. The recitation of numerical ranges by endpoints includes all numbers within that range (e.g., 3 to 5 includes 3, 3.2, 4, 4.70, and 5).

Figure 1:
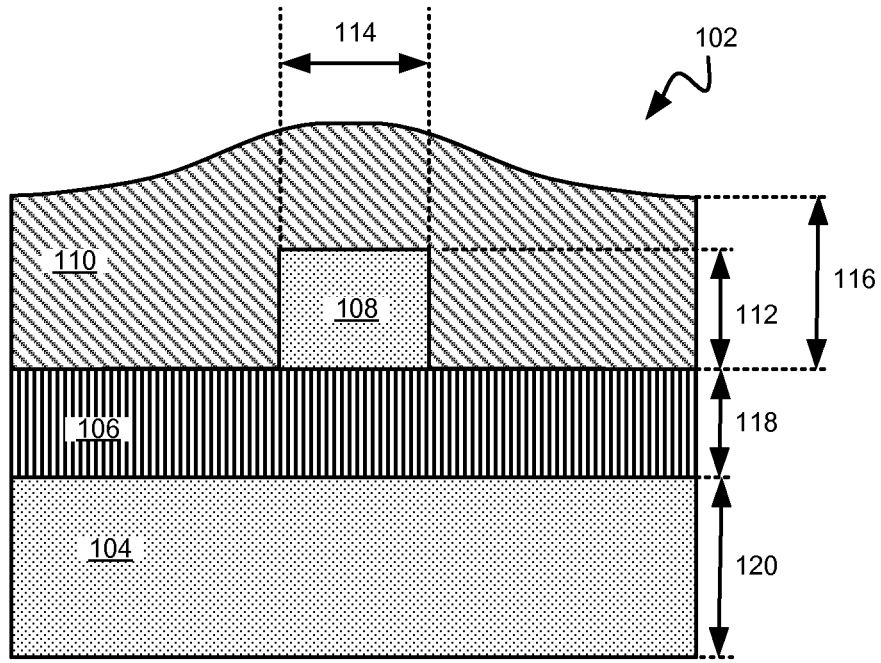
FIG. 1 presents a block diagram illustrating a silicon photonic device in accordance with described embodiments.

FIG. 1 depicts a silicon photonic device with a reduced thermo-optic effect in accordance with embodiments. Silicon photonic device 102 includes substrate 104 with undercladding layer 106, silicon core 108, and overcladding layer 110. Silicon core 108 has height 112 and width 114, and overcladding layer 110 has thickness 116, undercladding layer 106 has thickness 118, and substrate 104 has thickness 120.

Note that FIG. 1 depicts a cross section of silicon photonic device 102 perpendicular to the direction of travel of photons in silicon photonic device 102. In some embodiments silicon photonic device 102 may comprise a waveguide, an arrayed waveguide grating (AWG), a ring modulator, a Mach-Zehnder interferometer, a resonator, or a laser, and in some of these embodiments, silicon core 108 may be replaced by a ridged silicon core.

Substrate 104 may be any substrate for use with a silicon photonic device and may be or include a silicon wafer. In some embodiments, thickness 120 of substrate 104 may be 500 microns or more. Undercladding layer 106 is a layer that is electrically insulating and in some embodiments may be a layer of silicon dioxide. In some embodiments in which undercladding layer 106 is a silicon dioxide layer, it may also be called a buried oxide (BOX) layer. In some embodiments, undercladding layer 106 may have a thickness of approximately 2 microns.

Overcladding layer 110 is comprised of titanium dioxide and may include titanium dioxide in crystalline (mono- or poly-crystalline), and/or amorphous structure and may include multiple amorphous and crystalline regions. The crystalline portions may include anatase, rutile, and/or brookite crystalline forms. In some embodiments, overcladding layer 110 is comprised of amorphous titanium dioxide. In some embodiments, thickness 116 of overcladding layer 110 may be 2 microns.

During operation of silicon photonic device 102, photons of a desired wavelength or band of wavelengths may be transmitted in a mode of silicon photonic device 102. The effective index of refraction for photons in the mode may be expressed as:

$$n_{eff} = \Gamma_{core} n_{core} + \Gamma_{underclad} n_{underclad} + \Gamma_{overclad} n_{overclad} \quad (1)$$

where $\Gamma_{core}$, $\Gamma_{underclad}$, and $\Gamma_{overclad}$ are the percentage of power of the mode that is within silicon core 108, undercladding layer 106, and overcladding layer 110 respectively, and $n_{core}$, $n_{underclad}$, and $n_{overclad}$ are the index of refraction for photons in the mode due to silicon core 108, undercladding layer 106, and overcladding layer 110 respectively. Note that $\Gamma_{core}$, $\Gamma_{underclad}$, and $\Gamma_{overclad}$ may also be referred to, respectively, as the core, undercladding and overcladding confinement factors.

The effective thermo-optic coefficient (TOC) for a photon in a mode of silicon photonic device 102 can then be found by taking the derivative of equation 1 above with respect to temperature while assuming that the change in the core confinement factor, undercladding confinement factor and overcladding confinement factor with temperature is negligible. The derivative of equation 1 with respect to temperature (T) is:

$$\frac{\partial n_{eff}}{\partial T} = \Gamma_{core} \frac{\partial n_{core}}{\partial T} + \Gamma_{underclad} \frac{\partial n_{underclad}}{\partial T} + \Gamma_{overclad} \frac{\partial n_{overclad}}{\partial T} \quad (2)$$

In some embodiments equation 2 may be simplified if the rate of change of the index of refraction of undercladding layer 106 with respect to temperature ($TOC_{undeclared}$) can be ignored compared to the rate of change of the index of refraction of the silicon core 108 with respect to temperature ($TOC_{core}$) and rate of change of the index of refraction of the overcladding layer 110 with respect to temperature ($TOC_{overclad}$). In some embodiments, in which undercladding layer 106 is comprised of silicon dioxide, and overcladding layer 110 is comprised of titanium dioxide, since the TOC of silicon dioxide is approximately $10^{-5}$ while the TOC of silicon is approximately $1.8 \times 10^{-9}$ and the TOC of titanium dioxide is approximately $-2 \times 10^{-4}$, the TOC of undercladding layer 106 can be ignored compared to the TOCs of silicon core 108 and overcladding layer 110. In these embodiments, equation 2 may be simplified to:

$$\frac{\partial n_{eff}}{\partial T} \approx \Gamma_{core} \frac{\partial n_{core}}{\partial T} + \Gamma_{overclad} \frac{\partial n_{overclad}}{\partial T} \quad (3)$$

Then, to determine the conditions to achieve operation of silicon photonic device 102 with reduced thermo-optic effects, the effective TOC is set equal to zero. Equation 3 can then be rearranged to:

$$\frac{\Gamma_{overclad}}{\Gamma_{core}} \approx -\frac{TOC_{core}}{TOC_{overclad}} \quad (4)$$

As shown by equation 4, the thermo-optic effect may be reduced by configuring silicon photonic device 102 so that the ratio of the overcladding confinement factor to the core confinement factor is within a desired amount of negative one times the ratio between the thermo-optic coefficient of the core and the thermo-optic coefficient of the overcladding. In some embodiments, the ratio of $\Gamma_{overclad}$ to $\Gamma_{core}$ is in the range from 90% to 110% of negative one times the ratio of $TOC_{core}$ to $T_{overclad}$. Note that, due to the negative sign on the right-hand side of equation 4, for the wavelength(s) of operation of silicon photonic device 102, the TOC of silicon core 108 for the mode must have an opposite sign to the TOC of overcladding layer 110 for the mode. Thus, since the TOC of silicon, the material that silicon core 108 comprises, is positive, the TOC of the material of overcladding layer 110 must be negative. Cladding materials that may be used in addition to titanium dioxide may include, but are not limited to, a group 4 element from the periodic table, including an oxide of a group 4 element, such as hafnium dioxide.

In some embodiments, the core confinement factor ($\Gamma_{core}$) and the overcladding confinement factor ($\Gamma_{overclad}$) may be adjusted to desired values or within desired ranges by adjusting the shape and/or dimensions of silicon core 108 based on the indices of refraction of the silicon core 108, undercladding layer 106 and overcladding layer 110 at the desired wavelength or wavelength range(s) of operation. For example, when silicon photonic device 102 is operated in a wavelength range from 1500 nm to 1600 nm, undercladding layer 106 is comprised of silicon dioxide, overcladding layer 110 is comprised of amorphous silicon dioxide, height 112 of silicon core 108 may be between 200 nm and 250 nm and width 114 may be between 250 nm and 500 nm, thickness 116 may be 2 microns, and thickness 118 may be 2 microns. Note that in some embodiments thickness 116 and thickness 118 may be selected so that the portions of the desired mode(s) of silicon photonic device 102 that extend outside of overcladding layer 110 and undercladding layer 106 are negligible.

In some embodiments, silicon core 108 need not have a rectangular cross section, and may be any desired shape, including but not limited to a trapezoid, a triangle, a circle, an oval, or any other shape that can support a mode including a rib-type waveguide, and may have a tapered, stepped, or otherwise varying shape and/or cross section along the direction of propagation of the mode. Additionally, note that in some embodiments, undercladding layer 106 may also be comprised of an element from group 4 of the periodic table including an oxide of a group 4 element, and may be comprised of the same material as overcladding layer 110, including titanium dioxide.

Figure 2:
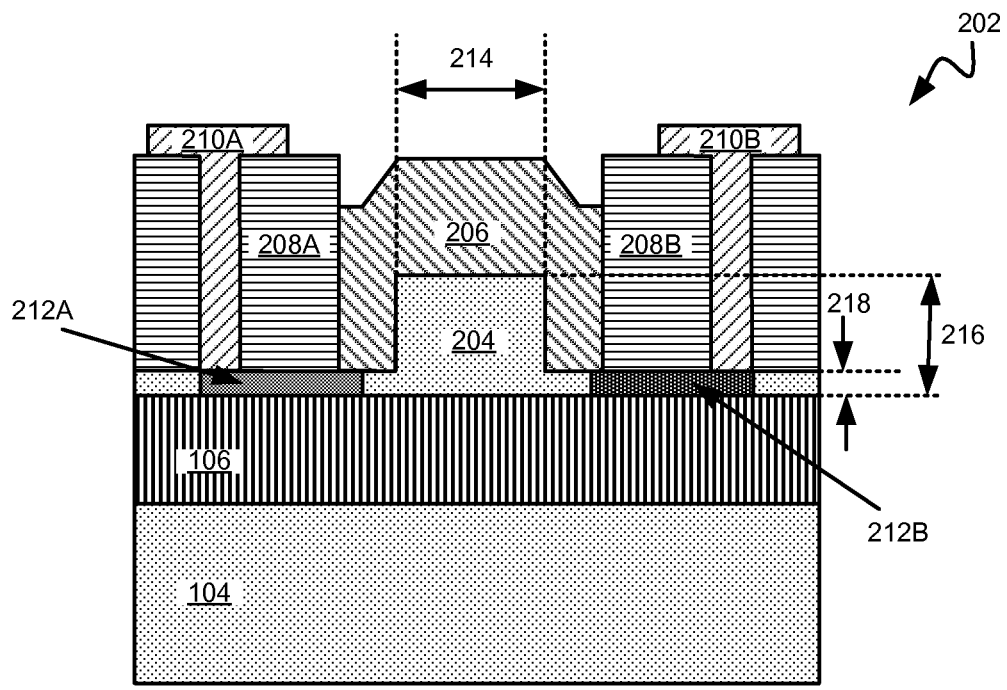
FIG. 2 presents a block diagram illustrating another silicon photonic device in accordance with described embodiments.

FIG. 2 depicts a silicon photonic device in accordance with embodiments. Silicon photonic device 202 comprises a modulator and includes substrate 104 with undercladding layer 106, silicon core 204, overcladding layer 206, insulating layers 208A and 208B, and metal contacts 210A and 210B connected, respectively, to doped regions 212A and 212B.

Silicon core 204 is part of a ridged waveguide with width 214, height 216 and thickness 218. Overcladding layer 206 may be comprised of the same material(s) as overcladding layer 110, including crystalline and/or amorphous titanium dioxide. Insulating layers 208A and 208B are electrically insulating and may be comprised of silicon dioxide. Metal contacts 210A and 210B may be any metal that can conduct an electric current and may be comprised of aluminum.

Note that the desired width 214 and height 216 of silicon core 204 may be determined using a process similar to that used to determine width 114 and height 112 of silicon core 108. For example, in embodiments in which undercladding layer 106 is comprised of silicon dioxide, and overcladding layer 206 is comprised of titanium dioxide, for a wavelength range from 1500 nm to 1600 nm, width 214 may be between 250 nm to 500 nm and height 216 may be between 200 nm and 250 nm. Thickness 218 may be from 20 nm to 50 nm.

Modulator 202 may be fabricated using conventional silicon photonic fabrication techniques that are also compatible with CMOS fabrication processes. An example of the fabrication techniques that may be used can be found in U.S. Provisional Application No. 61/985,166. The process used to fabricate a cladding layer such as overcladding layer 110 or overcladding layer 206 is discussed below.

Figure 3:
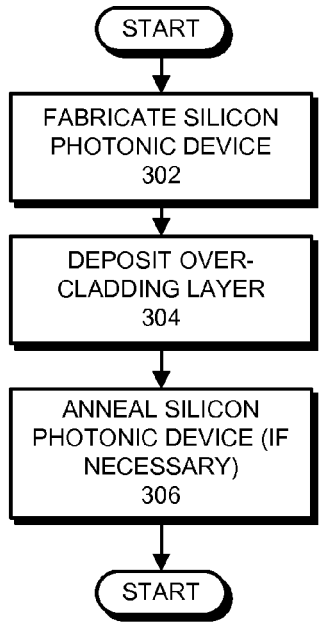
FIG. 3 presents a flowchart illustrating a process for fabricating a cladding layer on a silicon photonic device in accordance with described embodiments.

FIG. 3 presents a flowchart illustrating a process for fabrication of a cladding layer on a silicon photonic device such as silicon photonic device 102 or silicon photonic device 202, in accordance with embodiments. The process of FIG. 3 begins at step 302 with a silicon photonic device such as silicon photonic device 102 without overcladding layer 110 or silicon photonic device 202 without overcladding layer 206. At step 304 the overcladding layer is deposited on the silicon photonic device. Step 304 will be discussed in more detail below with reference to FIG. 4. At step 306 the silicon photonic device may be annealed if necessary. In some embodiments in which the overcladding layer comprises amorphous titanium dioxide and the silicon photonic device must be annealed, such as may be the case if the silicon photonic device includes metal contacts that require annealing, the silicon photonic device may be annealed at temperatures of up to 550° C. for up to 1 hour without substantially altering the structure of the titanium dioxide. In some embodiments, the annealing process may be conducted in a nitrogen atmosphere and have a ramp rate of up to 25° C./min.

In some embodiments, the overcladding layer applied in step 304 is comprised of a material, such as titanium dioxide, that includes one or more of the following properties: it is used in conventional CMOS processing, it is compatible with CMOS processing, and/or it is compatible with typical back-end-of-the-line (BEOL) CMOS processes. In some embodiments, compatibility with BEOL CMOS processes includes but is not limited to having a sufficient temperature stability to withstand BEOL CMOS processes, including processing at temperatures of less than or equal to 450° C. Furthermore in some embodiments, the process used to deposit the overcladding layer in step 304 comprises a process commonly used in CMOS foundries and may include but is not limited to RF magnetron sputtering. Additionally, in some embodiments, the process used to apply the overcladding layer in step 304 has a deposition rate greater than or equal to 1 nm/min.

Figure 4:
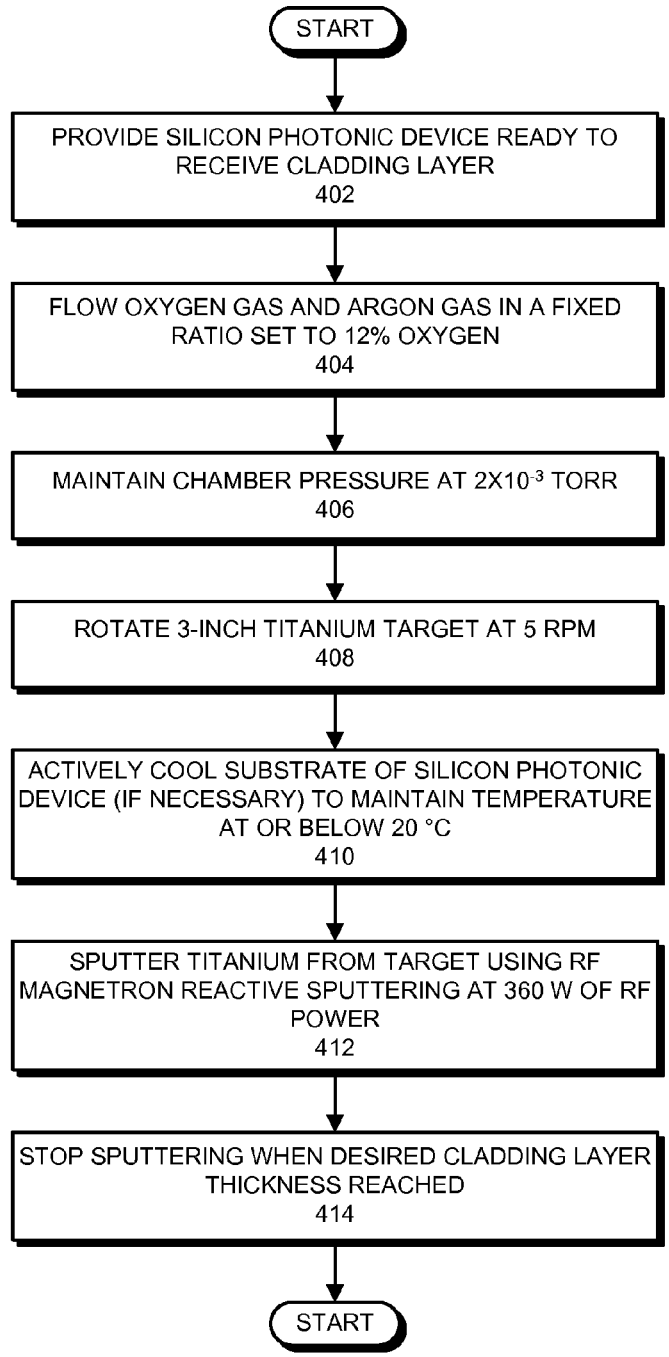
FIG. 4 presents a flowchart illustrating a process for depositing a cladding layer on a silicon photonic device in accordance with described embodiments.

FIG. 4 presents a flowchart illustrating a process for depositing a cladding layer such as overcladding layer 110 or overcladding layer 206 in accordance with embodiments. The process begins with a silicon photonic device, such as silicon photonic device 102 or silicon photonic device 202, or any other silicon photonic device it is desired to apply a cladding layer to in accordance with embodiments. In step 402, the silicon photonic device is provided in a state so that is ready to receive the cladding layer. Preparations may include, but are not limited to, masking of portions of the device to be protect from the cladding layer coating, or that otherwise should remain uncoated. The silicon photonic device is placed, or may already be, in a process chamber such as might be used as part of a conventional RF magnetron reactive sputtering process during CMOS processing In step 404 oxygen gas and argon gas are introduced into the chamber using two gas mass flow controllers running in a master-slave configuration, in a fixed flow ratio with 12% oxygen content. In some embodiments, the oxygen flow rate ratio may be set to be in the range from 9% to 15%, 12% to 18%, or 6% to 24%. At step 406, while the gas is flowing into the chamber, the total process chamber pressure is maintained at $2 \times 10^{-3}$ Torr.

In step 408, a 99.995% pure, 3-inch diameter titanium target is rotated at 5 rpm. At step 410, if necessary, the substrate of the silicon photonic device is actively cooled to maintain a temperature at or below 20° C. In some embodiments, the temperature of the silicon photonic device, and specifically the cladding layer being applied, may be a function of the rate of deposition of the cladding layer. Active cooling may not be needed in embodiments in which the deposition rate of the cladding layer is slow enough. In some embodiments, a deposition rate of less than or equal to 5 nm/minute may not require active cooling of the silicon photonic device during the process of depositing the cladding layer.

In step 412, titanium is sputtered from the target onto the silicon photonic device using RF magnetron reactive sputtering physical vapor deposition at an RF power of 360 watts. At step 414, the sputtering process is stopped when the desired cladding layer thickness is reached. In some embodiments, the process described above result in a titanium dioxide layer that is predominantly in the amorphous state.

In some embodiments, varying one or more of the process parameters, such as operating with a substrate temperature of above 20° C., may result in a cladding layer that has a substantial enough crystalline content so that propagation losses (e.g., due to scattering at crystalline grain boundaries) for one or more desired modes of the silicon photonic device are unacceptable. For example, operating under the condition described in FIG. 4, but with oxygen flow rate ratios of 12% and 18% was found to result in an amorphous structure for a titanium dioxide overcladding layer with a trace amount of anatase phase crystalline structure, while an oxygen flow rate ratio of 24% resulted in an amorphous structure with a trace amount of rutile phase crystalline structure. Operating at an oxygen flow rate of 6% or less was found to result in a cladding layer with titanium that had not been fully oxidized. Additionally, other parameters of the cladding, such as index of refraction, thermo-optic coefficient, and surface roughness, may be impacted by varying one or more of the parameters of the process in FIG. 4.

In some embodiments, the cladding layer may comprise a crystalline or polycrystalline structure. For example, an overcladding layer such as overcladding layer 110 or overcladding layer 206 may be or include amorphous titanium dioxide with one or more crystalline or poly-crystalline structures within the desired mode(s) of the silicon photonic device. In some embodiments, for an overcladding layer comprised of amorphous titanium dioxide and crystalline titanium dioxide, if for an x-ray rocking curve of the silicon photonic device, fewer than 5% of the total number of counts from the overcladding layer are due crystalline structure, then the optical loss due scattering may be less than or equal to 7 dB/cm. In some embodiments, the overcladding layer may be predominantly or entirely a single crystal of titanium dioxide for the portion of the overcladding layer that is within the desired mode(s) of the silicon photonic device if the overcladding layer has a loss below a desired value and the requirements for the reduction of the thermo-optic effect, such as mode confinement and TOC for equation 4 are met.

Note that in some embodiments other deposition processes may be used instead of or in addition to RF reactive sputtering, including but not limited to atomic layer deposition and any other physical layer deposition processes, including electron beam PVD, evaporative deposition, and pulsed laser deposition. In some embodiments, any process that is compatible with the silicon photonic device and can generate a cladding layer such as a titanium dioxide cladding layer that satisfies equation 4 and has an acceptable loss may be used.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A silicon photonic device, comprising:
a silicon core; and
a cladding layer comprising an overcladding layer and an undercladding layer adjacent to the silicon core, wherein the overcladding layer comprises amorphous titanium dioxide, wherein a negative thermo-optic coefficient of the overcladding layer reduces a thermo-optic effect in the silicon photonic device, and wherein for an x-ray rocking curve of the silicon photonic device, fewer than 5% of the total number of counts from the cladding layer are due to crystalline structure.

2. The silicon photonic device of claim 1, wherein the undercladding layer comprises silicon dioxide.

3. The silicon photonic device of claim 1, wherein:
the silicon photonic device comprises a waveguide, and wherein over a bandwidth of the silicon photonic device for a mode of the waveguide, a ratio of a fraction of a total power of the mode in the core to a fraction of the total power of the mode in the cladding is in the range from 90% to 110% of negative one times a ratio between a thermo-optic coefficient of the cladding to a thermo-optic coefficient of the core.

4. The silicon photonic device of claim 1, wherein:
a loss in the cladding layer for a wavelength of operation of the silicon photonic device is less than or equal to 7dB/cm.

5. The silicon photonic device of claim 1, wherein:
the silicon photonic device comprises at least one of: a waveguide, an arrayed waveguide grating, a ring modulator, a Mach-Zehnder interferometer, a resonator, and a laser.

6. The silicon photonic device of claim 1, wherein the overcladding layer further comprises crystalline titanium dioxide; and the undercladding layer comprises silicon dioxide.

7. The silicon photonic device of claim 1, wherein the undercladding layer comprises titanium adjacent to the silicon core.

8. A silicon photonic device, comprising:
a silicon core; and
a cladding layer comprising an overcladding layer and an undercladding layer adjacent to the silicon core, wherein the overcladding layer comprises a group 4 element from the periodic table, wherein a negative thermo-optic coefficient of the overcladding layer reduces a thermo-optic effect in the silicon photonic device, and wherein for an x-ray rocking curve of the silicon photonic device, fewer than 5% of the total number of counts from the cladding layer are due to crystalline structure.

9. The silicon photonic device of claim 8, wherein:
the overcladding layer comprises an oxide of the group 4 element, and the group 4 element includes one of titanium and hafnium, and wherein the undercladding layer comprises silicon dioxide.

10. The silicon photonic device of claim 8, wherein:
for a bandwidth of operation of the silicon photonic device, the silicon photonic device has a loss of less than or equal to 7 dB/cm.

11. The silicon photonic device of claim 8, wherein:
the silicon photonic device comprises a laser.

12. The silicon photonic device of claim 8, wherein:
the silicon photonic device comprises one of: a waveguide, an arrayed waveguide grating, a ring modulator, a resonator, and a Mach-Zehnder interferometer.

13. A method of preparing a silicon photonic device that includes a substrate, the method comprising:
providing a silicon core; and
depositing a cladding layer adjacent to the silicon core, wherein the cladding layer comprises an overcladding layer and an undercladding layer, wherein the overcladding layer comprises amorphous titanium dioxide, wherein a negative thermo-optic coefficient of the overcladding layer reduces a thermo-optic effect in the silicon photonic device, and wherein, during said depositing the cladding layer, an average temperature of the substrate is less than or equal to 20° C.

14. The method of claim 13, wherein:
the step of depositing the cladding layer comprises depositing the cladding layer at a rate of less than or equal to 5 nm/minute.

15. The method of claim 13, wherein:
the step of depositing the cladding layer comprises depositing the cladding layer using RF magnetron reactive sputtering.

16. The method of claim 13, wherein:
after the step of depositing the cladding layer, the method further includes:
annealing the silicon photonic device at a temperature of less than or equal to 550° C.

17. The method of claim 13, wherein:
depositing the cladding layer includes depositing the cladding layer using sputtering with an oxygen flow rate in the range from 6% to 24% of a total gas flow rate during the sputtering.

18. The method of claim 13, wherein:
depositing the cladding layer includes depositing the cladding layer using sputtering with an oxygen flow rate in the range from 12% to 18% of a total gas flow rate during the sputtering.

19. The method of claim 13, wherein:
for a mode of the silicon photonic device at a design wavelength of operation, a ratio of a fraction of a total power of the mode in the core to a fraction of the total power of the mode in the cladding layer is in the range from 90% to 110% of negative one times a ratio between a thermo-optic coefficient of the cladding layer to a thermo-optic coefficient of the core.

* * * * *